(12) United States Patent
Kajihara (10) Patent No.: US 10,262,930 B2
(45) Date of Patent: Apr. 16, 2019

(54) INTERPOSER AND METHOD FOR MANUFACTURING INTERPOSER

(71) Applicant: IBIDEN CO., LTD., Ogaki (JP)

(72) Inventor: Kazuki Kajihara, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/492,291

(22) Filed: Apr. 20, 2017

(65) Prior Publication Data

US 2017/0309558 A1    Oct. 26, 2017

(30) Foreign Application Priority Data

Apr. 20, 2016 (JP) .................. 2016-084133

(51) Int. Cl.
| | | |
|---|---|---|
| *H01L 23/13* | (2006.01) | |
| *H01L 23/29* | (2006.01) | |
| *H01L 23/31* | (2006.01) | |
| *H01L 25/00* | (2006.01) | |
| *H01L 25/10* | (2006.01) | |
| *H01L 23/498* | (2006.01) | |
| *H01L 23/00* | (2006.01) | |
| *H01L 21/48* | (2006.01) | |

(52) U.S. Cl.
CPC .... *H01L 23/49822* (2013.01); *H01L 21/4857* (2013.01); *H01L 23/293* (2013.01); *H01L 23/3128* (2013.01); *H01L 23/49816* (2013.01); *H01L 23/49827* (2013.01); *H01L 23/49838* (2013.01); *H01L 23/49894* (2013.01); *H01L 24/09* (2013.01); *H01L 24/17* (2013.01); *H01L 24/49* (2013.01); *H01L 25/105* (2013.01); *H01L 25/50* (2013.01); *H01L 23/13* (2013.01); *H01L 23/49833* (2013.01); *H01L 24/48* (2013.01); *H01L 2224/0401* (2013.01); *H01L 2224/04042* (2013.01); *H01L 2224/48091* (2013.01); *H01L 2225/1023* (2013.01); *H01L 2225/1058* (2013.01); *H01L 2225/1094* (2013.01)

(58) Field of Classification Search
None
See application file for complete search history.

(56) References Cited

U.S. PATENT DOCUMENTS

2010/0084175 A1\*  4/2010  Suzuki ............... H01L 21/4857
174/260

FOREIGN PATENT DOCUMENTS

JP    2012-119601 A    6/2012

\* cited by examiner

*Primary Examiner* — Kimberly N Rizkallah
*Assistant Examiner* — Bo B Jang
(74) *Attorney, Agent, or Firm* — Oblon, McClelland, Maier & Neustadt, L.L.P.

(57) ABSTRACT

An interposer includes an insulating layer, conductor circuits formed in grooves formed on a first surface of the insulating layer respectively, and metal posts formed in openings extending from the grooves to a second surface of the insulating layer on the opposite side with respect to the first surface such that the metal posts are connected to the conductor circuits respectively. The insulating layer has an opening portion which accommodates an electronic component and is extending from the first surface to the second surface of the insulating layer, and each of the metal posts has an upper surface and a bottom surface on the opposite side of the upper surface such that the upper surface is connected to a respective one of the conductor circuits and that the bottom surface is exposed from the second surface of the insulating layer.

20 Claims, 5 Drawing Sheets

INTERPOSER AND METHOD FOR MANUFACTURING INTERPOSER

CROSS-REFERENCE TO RELATED APPLICATIONS

The present application is based upon and claims the benefit of priority to Japanese Patent Application No. 2016-084133, filed Apr. 20, 2016, the entire contents of which are incorporated herein by reference.

BACKGROUND OF THE INVENTION

Field of the Invention

The present invention relates to an interposer having an opening part for accommodating an electronic component, and relates to a method for manufacturing the interposer.

Description of Background Art

Japanese Patent Laid-Open Publication No. 2012-119601 describes an interposer having a cavity part for accommodating a capacitor component. The entire contents of this publication are incorporated herein by reference.

SUMMARY OF THE INVENTION

According to one aspect of the present invention, an interposer includes an insulating layer, conductor circuits formed in grooves formed on a first surface of the insulating layer respectively, and metal posts formed in openings extending from the grooves to a second surface of the insulating layer on the opposite side with respect to the first surface such that the metal posts are connected to the conductor circuits respectively. The insulating layer has an opening portion which accommodates an electronic component and is extending from the first surface to the second surface of the insulating layer, and each of the metal posts has an upper surface and a bottom surface on the opposite side of the upper surface such that the upper surface is connected to a respective one of the conductor circuits and that the bottom surface is exposed from the second surface of the insulating layer.

According to another aspect of the present invention, a method for manufacturing an interposer includes forming conductor circuits on a support plate, forming a plating resist on the support plate such that the plating resist covers the conductor circuits and has openings exposing the conductor circuits respectively, filling the openings with a plating material such that metal posts including the plating material are formed in the openings of the plating resist respectively and that each of the metal posts has an upper surface connected to a respective one of the conductor circuit, removing the plating resist from the support plate such that the metal posts formed on the conductor circuits are exposed on the support plate, forming an insulating layer on the support plate such that the metal posts and the conductor circuits are embedded in the insulating layer, polishing the insulating layer in which the metal posts and the conductor circuits are embedded such that a bottom surface of each of the metal posts is formed to be exposed from a second surface of the insulating layer on the opposite side with respect to a first surface of the insulating layer having the conductor circuits in grooves on the first surface of the insulating layer, removing the support plate from the insulating layer having the metal posts and the conductor circuits, and forming an opening portion in the insulating layer such that the opening portion is formed to accommodate an electronic component and extending from the first surface to the second surface of the insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

First Embodiment

Figure 4A:
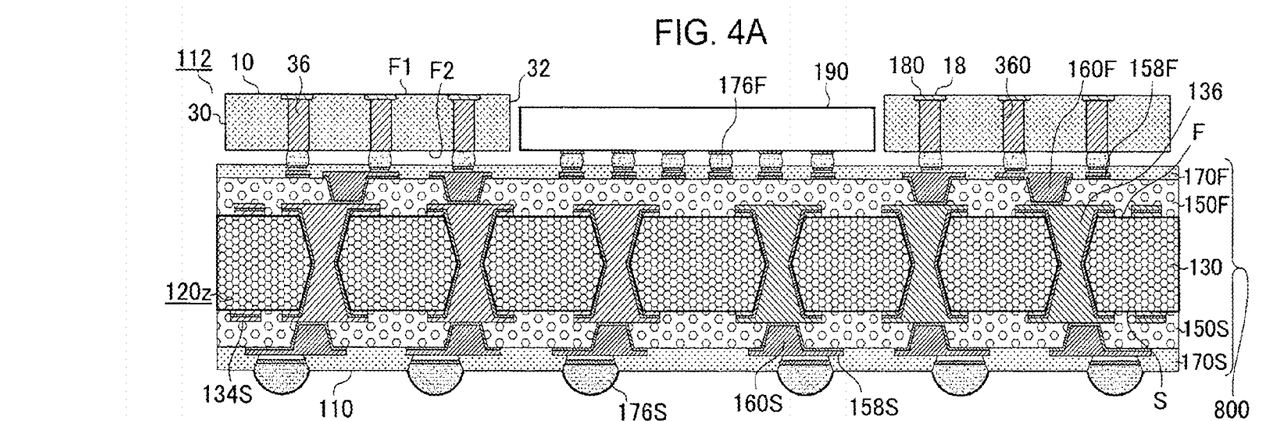
FIGS. 4A and 4B are cross-sectional views of a semiconductor device.
Figure 5A:
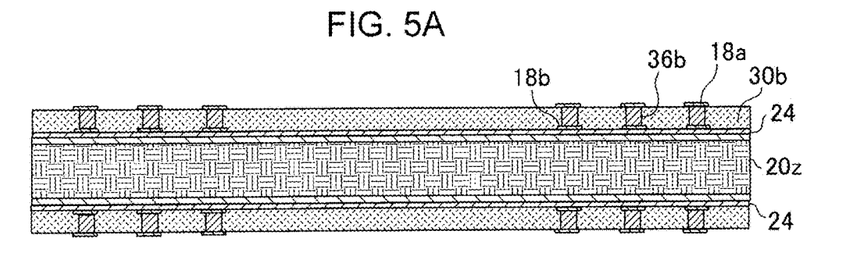
FIGS. 5A and 5B illustrate manufacturing process diagrams of an interposer of a second embodiment.

FIG. 4A is a cross-sectional view illustrating a semiconductor device 112 that includes an interposer 10 of a first embodiment, a printed wiring board 800 on which the interposer 10 is mounted, and a semiconductor element 190 that is accommodated in an opening part 32 of the interposer 10 and is mounted on the printed wiring board 800. FIG. 5C is a cross-sectional view illustrating a portion of the interposer 10 of the first embodiment. The interposer 10 has an insulating layer 30 that has a first surface (F1) and a second surface (F2). The insulating layer 30 has grooves 180 on the first surface (F1). Conductor circuits 18 are respectively formed in the grooves 180. The insulating layer 30 further has openings 360 that respectively extend from the grooves 180 to the second surface (F2). Metal posts 36 are respectively formed in the openings 360. The metal posts 36 each have an upper surface (36U) and a bottom surface (36B) that is on an opposite side of the upper surface (36U). The upper surfaces (36U) are respectively connected to the conductor circuits 18. Further, the insulating layer 30 has the opening part 32 extending from the first surface (F1) to the second surface (F2) at a substantially central portion of the insulating layer 30. The semiconductor element 190 is accommodated in the opening part 32.

The conductor circuits 18 each have an upper surface (18U), a bottom surface (18B) and a side surface (18W). The conductor circuits 18 are embedded in the insulating layer 30. The bottom surface (18B) and the side surface (18W) of each of the conductor circuits 18 are in contact with the insulating layer 30. A contact area between the conductor circuits 18 and the insulating layer 30 is large. Even when the interposer 10 having the opening part 32 is subjected to heat cycles and the interposer 10 warps, the conductor circuits 18 are unlikely to peel off from the insulating layer 30. A crack is unlikely to occur in the insulating layer 30. Further, since the conductor circuits 18 are embedded in the insulating layer 30, a thickness of the interposer 10 can be reduced. By embedding the conductor circuits 18 in the insulating layer 30, strength of the interposer 10 can be increased. Even when the interposer 10 has the opening part 32, warpage of the interposer 10 can be reduced.

The upper surfaces (18U) of the conductor circuits 18 are exposed from the first surface (F1) of the insulating layer 30. The upper surfaces (18U) of the conductor circuits 18 respectively form first electrodes (36D1).

The upper surfaces (36U) of the metal posts 36 are respectively connected to the bottom surfaces (18B) of the conductor circuits 18. Side surfaces (36W) of the metal posts 36 are in contact with the insulating layer 30. The bottom surfaces (36B) of the metal posts 36 are exposed from the second surface (F2) of the insulating layer 30. The bottom surfaces (36B) of the metal posts 36 respectively form second electrodes (36D2). Therefore, conductor circuits for external terminals connected to the bottom surfaces of the metal posts 36 are not required. The thickness of the interposer 10 can be reduced.

The upper surfaces (18U) (first electrodes (36D1)) of the conductor circuits 18 are not positioned on the same plane as the first surface (F1) of the insulating layer 30. The upper surfaces (18U) are recessed from the first surface (F1). A distance (K1) between each of the upper surfaces (18U) and the first surface (F1) is 1 µm or more and 10 µm or less.

The bottom surfaces (36B) (second electrodes (36D2)) of the metal posts 36 are not positioned on the same plane as the second surface (F2) of the insulating layer 30. The second electrodes (36D2) are recessed from the second surface (F2). A distance (K2) between each of the second electrodes (36D2) and the second surface (F2) is 1 µm or more and 10 µm or less.

Since the interposer 10 has the distances (K1, K2), the metal posts 36 are not directly subjected to an impact. Even when the metal posts 36 are thin, the metal posts 36 can be stable for a long period of time. Insulation reliability between adjacent first electrodes (36D1) is high. Insulation reliability between adjacent second electrodes (36D2) is high. Even when bumps are formed on the first electrodes (36D1) and the second electrodes (36D2), insulation reliability between adjacent bumps is high.

Protective films (72U) for respectively preventing oxidation of the first electrodes (36D1) can be respectively formed on the first electrodes (36D1). The protective films (72U) each have a surface (upper surface) (72U1) that is exposed from the first surface (F1). The upper surfaces (72U1) of the protective films (72U) are recessed from the first surface (F1). A distance (K3) between the upper surface (72U1) of each of the protective films (72U) and the first surface (F1) is 1 µm or more and 10 µm or less. Protective films (72L) for respectively preventing oxidation of the second electrodes (36D2) can be respectively formed on the second electrodes (36D2). The protective films (72L) each have a surface (upper surface) (72L1) that is exposed from the second surface (F2). The upper surfaces (72L1) of the protective films (72L) are recessed from the second surface (F2). A distance (K4) between the upper surface (72L1) of each of the protective films (72L) and the second surface (F2) is 1 µm or more and 10 µm or less. When the distances (K3, K4) exist, the metal posts 36 are not directly subjected to an impact. Even when the metal posts 36 are thin, the metal posts 36 can be stable for a long period of time. Insulation reliability between adjacent first electrodes (36D1) is high. Insulation reliability between adjacent second electrodes (36D2) is high. Even when bumps are formed on the first electrodes (36D1) and the second electrodes (36D2), insulation reliability between adjacent bumps is high.

Examples of the protective films (72U, 72L) include Ni/Au and OSP (Organic Solderability Preservative) films.

Figure 4B:
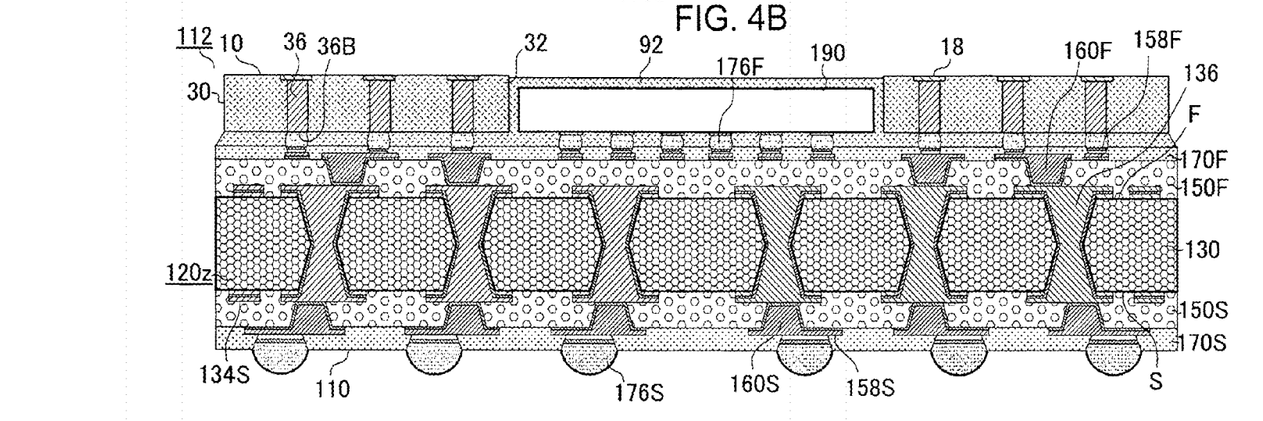

In the first embodiment, as illustrated in FIG. 4B, a mold resin 92 can be filled in between the interposer 10 and the electronic component 190 in the opening part 32 of the interposer 10. A material of the insulating layer 30 and a material of the mold resin 92 can be the same. When the material of the insulating layer 30 and the material of the mold resin 92 are different, a thermal expansion coefficient of the insulating layer 30 and a thermal expansion coefficient of the mold resin 92 are preferably the same. The mold resin 92 is unlikely to peel off from interposer 10. Warpage of the interposer 10 can be reduced.

Content of an inorganic filler in the insulating layer 30 is 75 wt % or more and 85 wt % or less. When the interposer 10 is mounted on the printed wiring board 800 illustrated in FIG. 4A, content of an inorganic filler in resin insulating layers (150F, 150S) of the printed wiring board 800 is less than 75 wt %. For example, the content of the inorganic filler in the resin insulating layers (150F, 150S) is 40 wt % or more and 60 wt % or less.

A difference between the thermal expansion coefficient of the insulating layer 30 and the thermal expansion coefficient of the mold resin 92 is small. Therefore, a thermal stress due to the difference in thermal expansion coefficient is unlikely to occur. A crack is unlikely to enter the mold resin 92 and the insulating layer 30 from a corner of the opening part 32. Reliability of the interposer 10 or the semiconductor device 112 of FIG. 4B is unlikely to deteriorate. Further, since the bottom surfaces (36B) of the metal posts 36 respectively form the second electrodes (36D2), a distance between adjacent metal posts 36 can be reduced. The interposer 10 can be densified.

In the first embodiment, the metal posts 36 are not formed in a central portion of the interposer 10. The metal posts 36 are formed only in an outer periphery region of the interposer 10. By having the opening part 32, the interposer of the first embodiment can easily release a stress. Further, a deformation amount of the interposer 10 can be reduced. Stress acting on the metal posts 36 can be reduced.

Figure 1:
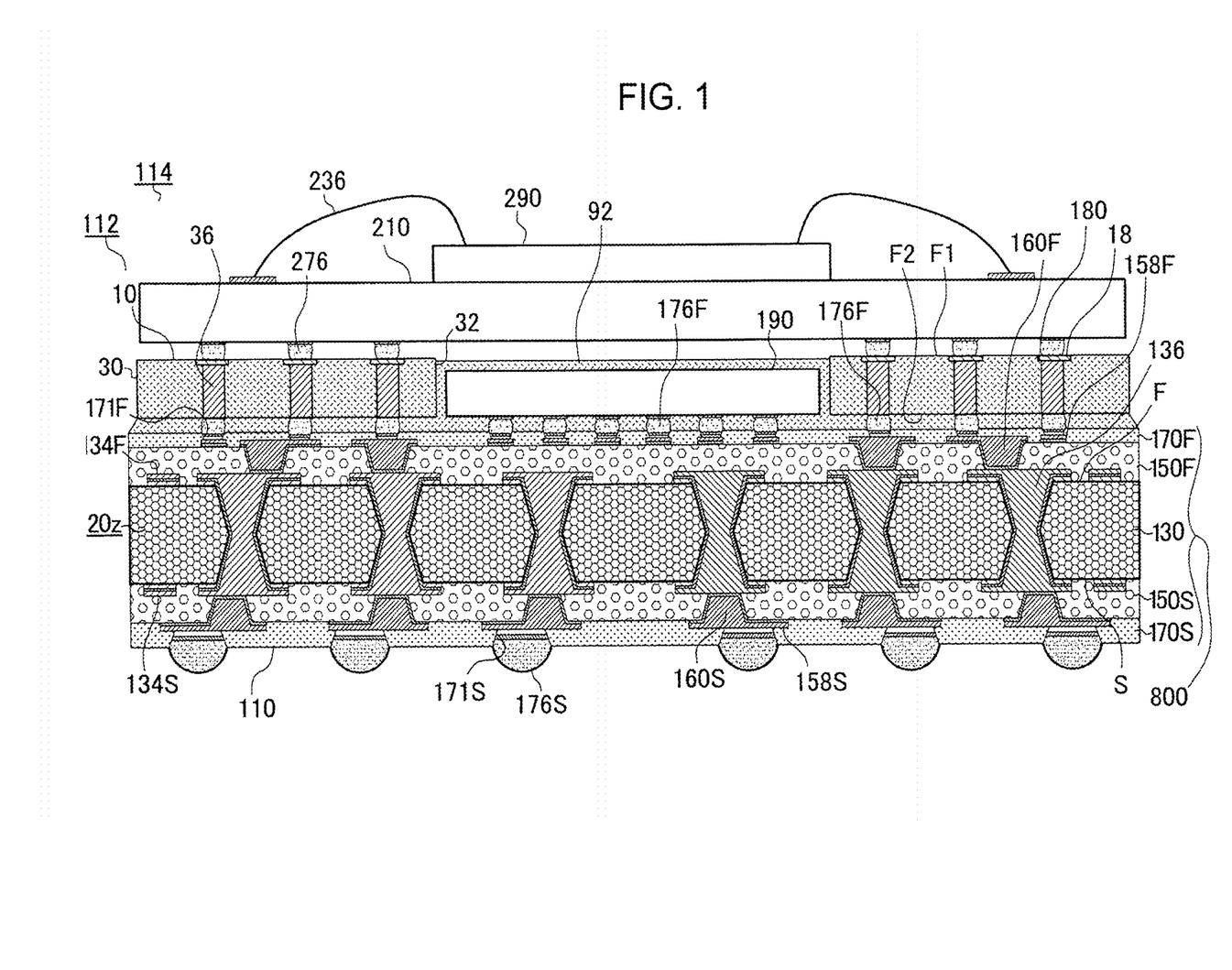
FIG. 1 is a cross-sectional view of an application example of an interposer of a first embodiment of the present invention.

FIG. 1 illustrates a cross section of an application example 114 of the interposer 10 of the first embodiment.

The application example 114 is formed by the printed wiring board 800 on which the electronic component 190 is mounted, the interposer 10 having the opening part 32, and a second printed wiring board 210 on which an electronic component 290 is mounted. Examples of the electronic components (190, 290) are semiconductor elements. An example of the electronic component 190 is an IC chip, and an example of the electronic component 290 is a memory. The interposer 10 and the printed wiring board 800 are connected via solder bumps (176F). The semiconductor device 112 is formed by the interposer 10 and the printed wiring board 800 on which the semiconductor element 190 is mounted. In FIG. 1, the second printed wiring board 210 is mounted on the interposer 10, and the second printed wiring board 210 and the interposer 10 are connected via solder bumps 276. The electronic component 290 is mounted on the second printed wiring board 210. The second printed wiring board 210 and the electronic component 290 are connected via wires 236.

The IC chip 190 is mounted on a substantially central portion of the printed wiring board 800. The opening part 32 of the interposer 10 is an opening for accommodating the electronic component 190, and penetrates the interposer 10. The opening part 32 penetrates the insulating layer 30. Further, the opening part 32 is formed at a substantially central portion of the interposer 10. The mold resin 92 for sealing the semiconductor element 190 is filled in between the semiconductor element 190 in the opening part 32 and the interposer 10. The mold resin 92 for sealing the IC chip 190 is also filled in between the interposer 10 and the printed wiring board 800.

The printed wiring board 800 has a core substrate 130. The core substrate 130 has an insulating substrate (120z) that has a third surface (F) and a fourth surface (S) that is on an opposite side of the third surface (F), a first conductor layer (134F) that is formed on the third surface (F) of the insulating substrate, and a second conductor layer (134S) that is formed on the fourth surface of the insulating substrate. The core substrate further has through-hole conductors 136 that connect the first conductor layer (134F) and the second conductor layer (134S).

An uppermost resin insulating layer (150F) is formed on the third surface (F) of the insulating substrate (120z) and on the first conductor layer (134F). An uppermost conductor layer (158F) is formed on the resin insulating layer (150F). The conductor layer (158F) and the first conductor layer (134F) or the through-hole conductors 136 are connected by uppermost via conductors (160F) that penetrate the resin insulating layer (150F).

A lowermost resin insulating layer (150S) is formed on the fourth surface (S) of the insulating substrate (120z) and on the second conductor layer (134S). A lowermost conductor layer (158S) is formed on the resin insulating layer (150S). The conductor layer (158S) and the second conductor layer (134S) or the through-hole conductors 136 are connected by lowermost via conductors (160S) that penetrate the resin insulating layer (150S).

A first solder resist layer (170F) having openings (171F) is formed on the uppermost resin insulating layer (150F) and on the uppermost conductor layer (158F). Portions of the conductor layer (158F) that are respectively exposed from the openings (171F) form pads, and first solder bumps (176F) are respectively formed on the pads.

A second solder resist layer (170S) having openings (171S) is formed on the lowermost resin insulating layer (150S) and on the lowermost conductor layer (158S). Portions of the conductor layer (158S) that are respectively exposed from the openings (171S) form pads, and second solder bumps (176S) are respectively formed on the pads.

In the first embodiment, the interposer 10 has substantially a shape of a cube. The IC chip 190 is accommodated in the opening part 32 of the interposer. Therefore, a thickness of the semiconductor device 112 can be reduced. The metal posts 36 of the interposer 10 of the first embodiment are thin. An interval between adjacent metal posts 36 is narrow. The metal posts 36 can be densely arrayed. Therefore, even when the interposer 10 has the opening part 32, data transmission is possible between the IC chip 190 and the memory 290 using the interposer 10 of a small size.

Method for Manufacturing Interposer of First Embodiment

A method for manufacturing the interposer 10 of the first embodiment is illustrated in FIGS. 2A-2E and 3A-3E.

Figure 2A:
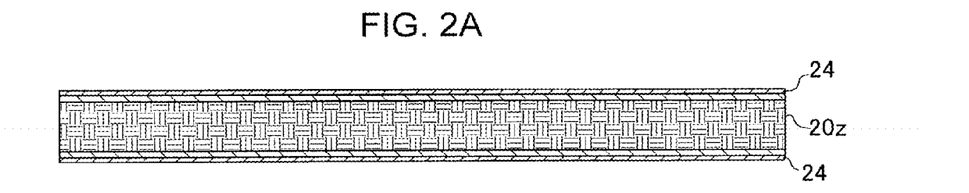
FIG. 2A-2E are manufacturing process diagrams of the interposer of the first embodiment.

A support plate (20z) and a metal foil 24 are prepared (FIG. 2A). In FIG. 2A, the metal foil 24 is laminated on the support plate (20z). Examples of the support plate (20z) include a metal plate and a double-sided copper-clad laminated plate. Examples of the metal foil 24 include a copper foil and a nickel foil.

Figure 2B:
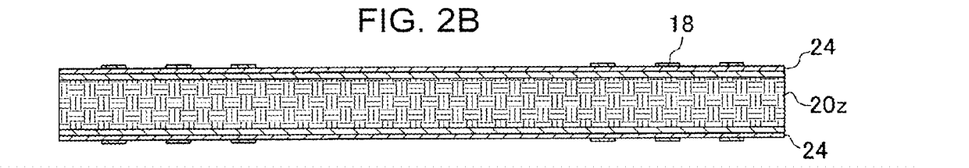
Figure 2C:
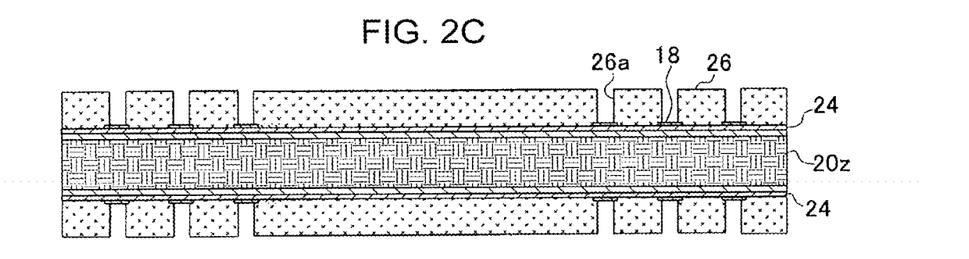
Figure 2D:
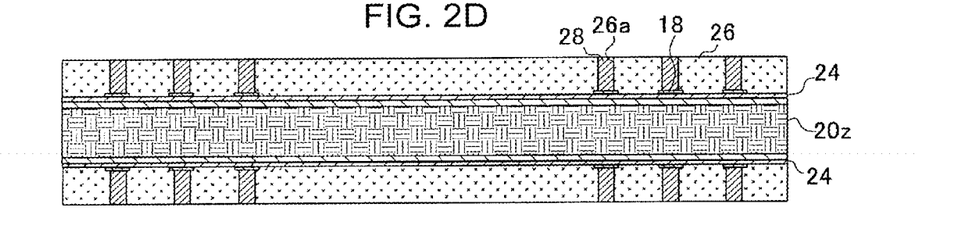
Figure 2E:
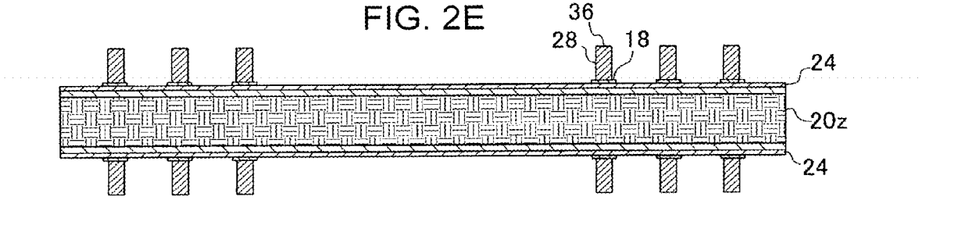

The conductor circuits 18 are formed on the metal foil 24 by electrolytic copper plating (FIG. 2B). A plating resist 26 having openings (26a) for forming the metal posts is formed on the support plate (20z) and the conductor circuits 18 (FIG. 2C). Electrolytic plating films 28 are respectively formed in the openings (26a) of the plating resist (FIG. 2D). The plating resist is removed. The metal posts 36 are respectively formed from the electrolytic plating films 28 (FIG. 2E). The metal posts 36 are respectively formed from the electrolytic plating films only.

Figure 3A:
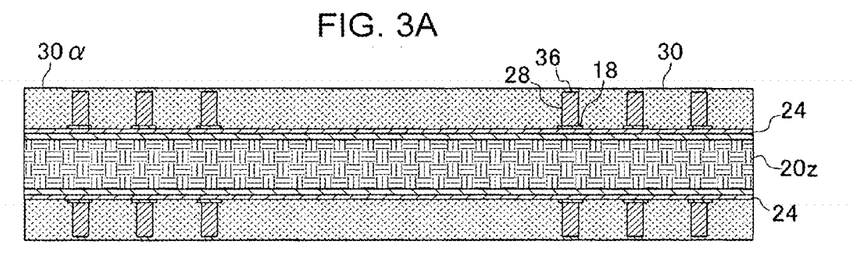
FIG. 3A-3E are manufacturing process diagrams of the interposer of the first embodiment.

The insulating layer 30 composed of a mold resin is formed on the metal posts 36 and the metal foil 24. The conductor circuits 18 and the metal posts 36 are embedded in the insulating layer (FIG. 3A). Content of an inorganic filler in the insulating layer 30 is 75 wt % or more and 85 wt % or less.

Figure 3B:
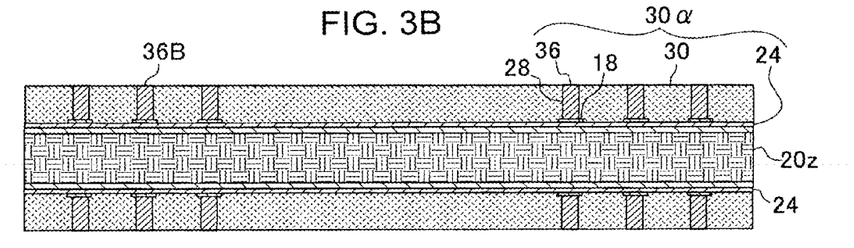
Figure 3C:
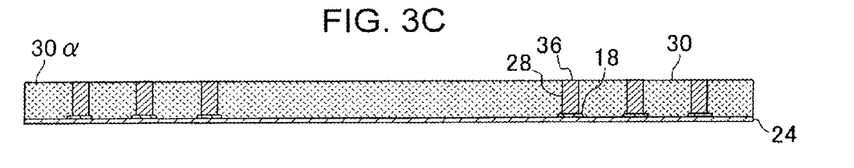
Figure 3D:
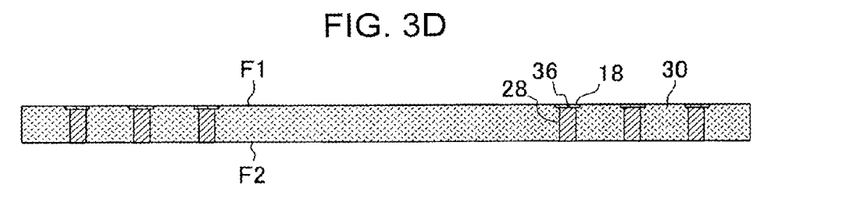

The insulating layer 30 and the metal posts 36 are polished (FIG. 3B). The bottom surfaces (36B) (second electrodes (36D2)) of the metal posts 36 are exposed. An intermediate (30α) including the metal foil 24, the conductor circuits 18, the insulating layer 30 and the metal posts 36 is formed on the support plate (20z). The intermediate (30α) is separated from the support plate (20z) (FIG. 3C). The metal foil 24 is removed by etching (FIG. 3D). In this case, as illustrated in FIG. 5C, the upper surfaces (18U) of the conductor circuits 18 are recessed from the first surface (F1) of the insulating layer 30, and the bottom surfaces (36B) of the metal posts 36 are recessed from the second surface (F2) of the insulating layer 30. Thereafter, the protective films (72U) are respectively formed on the upper surfaces (18U) of the conductor circuits 18. The protective films (72L) are respectively formed on the bottom surfaces (36B) of the metal posts 36 (FIG. 5C).

Figure 3E:
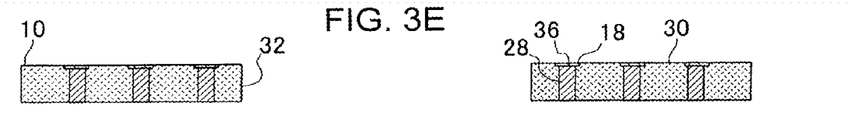

A central portion of the insulating layer 30 is removed. The opening part 32 for accommodating an electronic component is formed and the interposer 10 is completed (FIG. 3E). The opening part 32 is formed, for example, using laser, by punching, or using a router.

As illustrated in FIG. 4A, pads of the printed wiring board 800 on which the electronic component 190 is mounted and the bottom surfaces (36B) of the (second electrodes (36D2)) of the metal posts 36 of the interposer 10 are connected by the solder bumps (176F). Thereby, the interposer 10 is mounted on the printed wiring board 800. As illustrated in FIG. 4A, the semiconductor element 190 is accommodated in the opening part 32 of the interposer 10. The mold resin 92 is filled in between the interposer and the printed wiring board. The mold resin 92 is filled in a gap between the interposer 10 and the semiconductor element 190. The material of the mold resin 92 and the material of the insulating layer 30 are the same. The semiconductor device 112 of FIG. 4B is completed. As illustrated in FIG. 1, the conductor circuits 18 of the interposer 10 and electrodes of the second printed wiring board 210 are connected by the solder bumps 276. Thereby, the second printed wiring board 210 is mounted on the interposer. The application example 114 is formed.

Second Embodiment

Figure 5B:
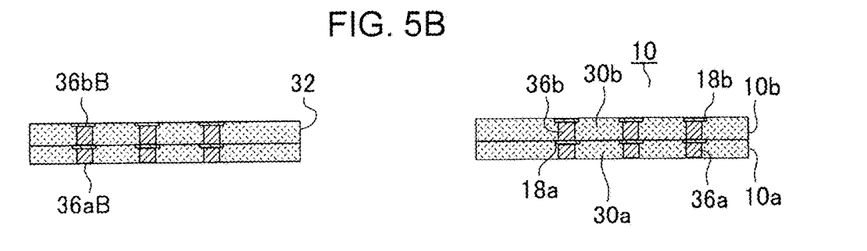
Figure 5C:
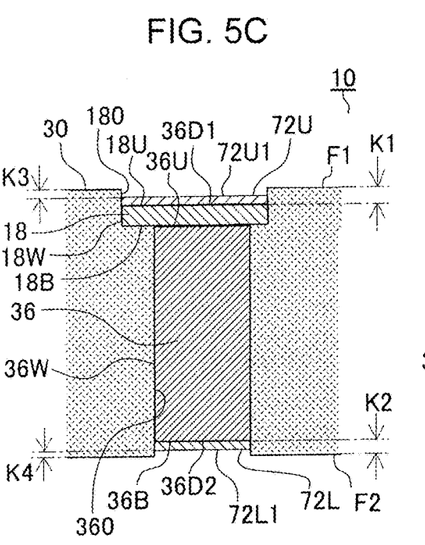
FIG. 5C illustrates a portion of the interposer of the first embodiment.

FIG. 5B illustrates a cross section of an interposer 10 of a second embodiment.

In the interposer 10 of the second embodiment, on an interposer (first interposer) (10a) of the first embodiment, another interposer (second interposer) (10b) of the first embodiment is laminated.

The insulating layer of the first interposer (10a) is a first insulating layer (30a); the conductor circuits of the first interposer (10a) are first conductor circuits (18a); and the metal posts of the first interposer (10a) are first metal posts (36a).

The insulating layer of the second interposer (10b) is a second insulating layer (30b); the conductor circuits of the second interposer (10b) are second conductor circuits (18b); and the metal posts of the second interposer (10b) are second metal posts (36b).

The second metal posts (36b) of the second interposer (10b) are respectively connected to the first conductor circuits (18a) of the first metal posts (36a) of the first interposer (10a).

Method for Manufacturing Interposer of Second Embodiment

Figure 5D:
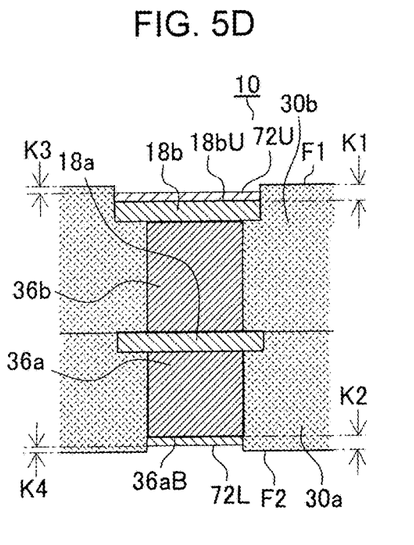
FIG. 5D illustrates a portion of the interposer of the second embodiment.

A method for manufacturing the interposer 10 of the second embodiment is illustrated in FIGS. 5A and 5B. The conductor circuits (first conductor circuit) (18a) are formed on the bottom surfaces (36bB) of the metal posts (second metal posts) (36b) of the intermediate (30α) of FIG. 3B (FIG. 5A). Thereafter, the processes illustrated in FIGS. 2C-2E and 3A-3E are performed. The interposer 10 of the second embodiment illustrated in FIG. 5B is formed. The interposer 10 of the second embodiment and the printed wiring board 800 are connected to each other via the bottom surfaces (36aB) of the first metal posts (36a). The interposer 10 of the second embodiment and the second printed wiring board 210 are connected to each other via the second conductor circuits (18b). As illustrated in FIG. 5D, similar to the interposer 10 of the first embodiment, the interposer 10 of the second embodiment has the protective films (72U, 72L) and the distances (K1, K2, K3, K4).

In the second embodiment, a thickness of each of the first insulating layer (30a) and the second insulating layer (30b) is half that of the insulating layer 30 of the first embodiment. Therefore, a height of each of the first metal posts (36a) and the second metal posts (36b) that are formed by electrolytic plating is half that of each of the metal posts 36 of the first embodiment. The first metal posts (36a) and the second metal posts (36b) can each be formed in a short time. Further, the second metal posts (36b) are respectively laminated on the first metal posts (36a). Therefore, a stress can be relaxed by the metal posts.

According to Japanese Patent Laid-Open Publication No. 2012-119601, the interposer of Japanese Patent Laid-Open Publication No. 2012-119601 has a bump forming part. The bump forming portion has a conductive film and an insulating layer, and is formed on a back surface of a silicon substrate. As illustrated in Japanese Patent Laid-Open Publication No. 2012-119601, the conductive film protrudes from the silicon substrate. Since the interposer of Japanese Patent Laid-Open Publication No. 2012-119601 has a cavity part, strength of the interposer is likely to be reduced. Therefore, when the interposer of Japanese Patent Laid-Open Publication No. 2012-119601 is subjected to heat cycles, the interposer of Japanese Patent Laid-Open Publication No. 2012-119601 is expected to have large warp. Due to the warping, a stress is likely to act at an interface between the conductive film and the silicon substrate. Due to the stress, the conductive film may peel off from the silicon substrate. Due to the peeling, the silicon substrate may break.

An interposer according to an embodiment of the present invention includes: an insulating layer that has a first surface, a second surface that is on an opposite side of the first surface, multiple grooves that are formed on the first surface, openings that respectively extend from the grooves to the second surface, and an opening part extending from the first surface to the second surface for accommodating an electronic component; conductor circuits that are respectively formed in the grooves; and metal posts that are respectively formed in the openings and connected to the conductor circuits. The metal posts each have an upper surface and a bottom surface that is on an opposite side of the upper surface, the upper surfaces being respectively connected to the conductor circuits, and the bottom surfaces being exposed from the second surface.

A multilayer type interposer according to an embodiment of the present invention includes: a first interposer that is formed by an interposer according to an embodiment of the present invention; and a second interposer that is formed by an interposer according to an embodiment of the present invention and is laminated on the first interposer. The second interposer is laminated on the first interposer such that conductor circuits of the first interposer are respectively connected to metal posts of the second interposer.

A semiconductor device according to an embodiment of the present invention includes: a printed wiring board that has a resin insulating layer; a semiconductor element that is mounted on the printed wiring board; and an interposer according to an embodiment of the present invention that is laminated on the printed wiring board such that the semiconductor element is accommodated in an opening part of the interposer according to an embodiment of the present invention. An insulating layer of the interposer according to an embodiment of the present invention is formed of an epoxy resin and an inorganic filler. Content of the inorganic filler in the insulating layer is 75 wt % or more and 85 wt % or less. Content of an inorganic filler contained in the resin insulating layer of the printed wiring board is less than 75 wt %.

A semiconductor device according to another aspect of the present invention includes: a printed wiring board; a semiconductor element that is mounted on the printed wiring board; an interposer according to an embodiment of the present invention that is laminated on the printed wiring board such that the semiconductor element is accommodated in an opening part of the interposer according to an embodiment of the present invention; and a mold resin that is formed between the semiconductor element and the interposer according to an embodiment of the present invention. A thermal expansion coefficient of the mold resin and a thermal expansion coefficient of an insulating layer of the interposer according to an embodiment of the present invention are equal to each other.

A method for manufacturing an interposer according to an embodiment of the present invention includes: preparing a support plate; forming conductor circuits on the support plate; forming a plating resist on the support plate and the conductor circuits, the plating resist having openings for respectively exposing the conductor circuits; forming metal posts by filling the openings with plating; removing the plating resist; forming an insulating layer on the support plate such that the metal posts and the conductor circuits are embedded; polishing the insulating layer and the metal posts; removing the support plate; and forming an opening part for accommodating an electronic component at a central portion of the insulating layer.

In an interposer according to an embodiment of the embodiment, the conductor circuits are unlikely to peel off from the insulating layer. Even when an interposer of an embodiment is subjected to heat cycles, reliability of the interposer is unlikely to deteriorate.

Obviously, numerous modifications and variations of the present invention are possible in light of the above teachings. It is therefore to be understood that within the scope of the appended claims, the invention may be practiced otherwise than as specifically described herein.

The invention claimed is:

1. A semiconductor device, comprising:
a printed wiring board;
a semiconductor element mounted on the printed wiring board;
an interposer laminated on the printed wiring board such that the semiconductor element is accommodated in an opening portion of the interposer; and
a mold resin structure formed between the interposer and the semiconductor element in the opening portion of the interposer,
wherein the mold resin structure and an insulating layer of the interposer are formed such that a thermal expansion coefficient of the mold resin structure and a thermal expansion coefficient of the insulating layer are equal to each other, the interposer comprises the insulating layer, a plurality of conductor circuits formed in a plurality of grooves formed on a first surface of the insulating layer respectively, and a plurality of metal posts formed in a plurality of openings extending from the grooves to a second surface of the insulating layer on an opposite side with respect to the first surface such that the metal posts are connected to the conductor circuits respectively, the insulating layer has the opening portion configured to accommodate the semiconductor element and extending from the first surface to the second surface of the insulating layer, and each of the metal posts has an upper surface and a bottom surface on an opposite side of the upper surface such that the upper surface is connected to a respective one of the conductor circuits and that the bottom surface is exposed from the second surface of the insulating layer.

2. The semiconductor device according to claim 1, wherein the insulating layer comprises an inorganic filler and a resin material comprising an epoxy resin.

3. The semiconductor device according to claim 2, wherein the insulating layer is formed such that the opening portion is positioned in a central portion of the insulating layer.

4. The semiconductor device according to claim 3, further comprising:
a second printed wiring board mounted on the interposer such that the second printed wiring board is positioned on an opposite side of the interposer with respect to the printed wiring board.

5. The semiconductor device according to claim 1, further comprising:
a second printed wiring board mounted on the interposer such that the second printed wiring board is positioned on an opposite side of the interposer with respect to the printed wiring board.

6. The semiconductor device according to claim 5, further comprising:
a second semiconductor element mounted on the second printed wiring board.

7. The semiconductor device according to claim 6, wherein the printed wiring board is connected to the interposer through a plurality of first solder balls on the second surface of the insulating layer at the plurality of metal posts, and the second printed wiring board is connected to the interposer through a plurality of second solder balls on the first surface of the insulating layer at the plurality of conductor circuits.

8. The semiconductor device according to claim 7, wherein the semiconductor element is an IC chip, and the second semiconductor element is a memory.

9. The semiconductor device according to claim 6, wherein the semiconductor element is an IC chip, and the second semiconductor element is a memory.

10. The semiconductor device according to claim 5, wherein the printed wiring board is connected to the interposer through a plurality of first solder balls on the second surface of the insulating layer at the plurality of metal posts, and the second printed wiring board is connected to the interposer through a plurality of second solder balls on the first surface of the insulating layer at the plurality of conductor circuits.

11. The semiconductor device according to claim 2, further comprising:
a second printed wiring board mounted on the interposer such that the second printed wiring board is positioned on an opposite side of the interposer with respect to the printed wiring board.

12. The semiconductor device according to claim 11, further comprising:
a second semiconductor element mounted on the second printed wiring board.

13. The semiconductor device according to claim 1, wherein the insulating layer comprises the inorganic filler in an amount in a range of 75 wt % to 85 wt %.

14. The semiconductor device according to claim 13, wherein the insulating layer is formed such that the opening portion is positioned in a central portion of the insulating layer.

15. The semiconductor device according to claim 13, further comprising:
a second printed wiring board mounted on the interposer such that the second printed wiring board is positioned on an opposite side of the interposer with respect to the printed wiring board.

16. The semiconductor device according to claim 15, further comprising:
a second semiconductor element mounted on the second printed wiring board.

17. The semiconductor device according to claim 1, wherein the insulating layer is formed such that the opening portion is positioned in a central portion of the insulating layer.

18. The semiconductor device according to claim 17, further comprising:
a second printed wiring board mounted on the interposer such that the second printed wiring board is positioned on an opposite side of the interposer with respect to the printed wiring board.

19. The semiconductor device according to claim 18, further comprising:
a second semiconductor element mounted on the second printed wiring board.

20. The semiconductor device according to claim 1, wherein the printed wiring board is connected to the interposer through a plurality of first solder balls on the second surface of the insulating layer at the plurality of metal posts.

* * * * *